US012791934B2

(12) United States Patent
Liu et al.

(10) Patent No.: US 12,791,934 B2
(45) Date of Patent: Nov. 10, 2026

(54) RETICLE COVERING PELLICLE FOR PHOTOLITHOGRAPHY SCANNER

(71) Applicant: Taiwan Semiconductor Manufacturing Company, Hsinchu (TW)

(72) Inventors: Yen-Hao Liu, Hsinchu (TW); Shao-Hua Wang, Taoyuan (TW); Chueh-Chi Kuo, Kaohsiung (TW); Li-Jui Chen, Hsinchu (TW); Heng-Hsin Liu, New Taipei (TW)

( * ) Notice: Subject to any disclaimer, the term of this patent is extended or adjusted under 35 U.S.C. 154(b) by 1065 days.

(21) Appl. No.: 17/882,705

(22) Filed: Aug. 8, 2022

(65) Prior Publication Data

US 2024/0045323 A1 Feb. 8, 2024

(51) Int. Cl.

| | |
|---|---|
| ***G03F 1/64*** | (2012.01) |
| ***G03F 7/00*** | (2006.01) |
| ***G03F 7/20*** | (2006.01) |
| ***H10P 76/20*** | (2026.01) |

(52) U.S. Cl.

CPC .............. *G03F 1/64* (2013.01); *G03F 7/2004* (2013.01); *G03F 7/70983* (2013.01); *H10P 76/2041* (2026.01)

(58) Field of Classification Search

CPC ..................................... G03F 1/62; G03F 1/64

See application file for complete search history.

(56) References Cited

U.S. PATENT DOCUMENTS

2019/0146332 A1* 5/2019 Van Zwol ........... G03F 7/70316 430/5
2022/0244634 A1* 8/2022 Hsu ........................... G03F 1/82

* cited by examiner

*Primary Examiner* — Daborah Chacko-Davis

(74) *Attorney, Agent, or Firm* — Lippes Mathias LLP

(57) ABSTRACT

A pellicle assembly is provided for an associated reticle of an extreme ultraviolet (EUV) scanner. The pellicle assembly includes: a pellicle membrane; and a frame configured to mount the pellicle membrane to the associated reticle. Suitably, the pellicle membrane includes: a nanotube material layer; a first protective layer; a second protective layer; an infrared (IR) active layer arranged between the first protective layer and the second protective layer, the IR active layer filtering out IR wavelengths of light passing therethrough; and a deep ultraviolet (DUV) active layer arranged between the first protective layer and the second protective layer, the DUV active layer filtering out DUV wavelengths of light passing therethrough.

20 Claims, 4 Drawing Sheets

1000

RETICLE COVERING PELLICLE FOR PHOTOLITHOGRAPHY SCANNER

BACKGROUND

The following relates to the semiconductor arts, and in particular, to a method and/or apparatus for patterning a layer on a semiconductor wafer or substrate using extreme ultraviolet (EUV) lithography during the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
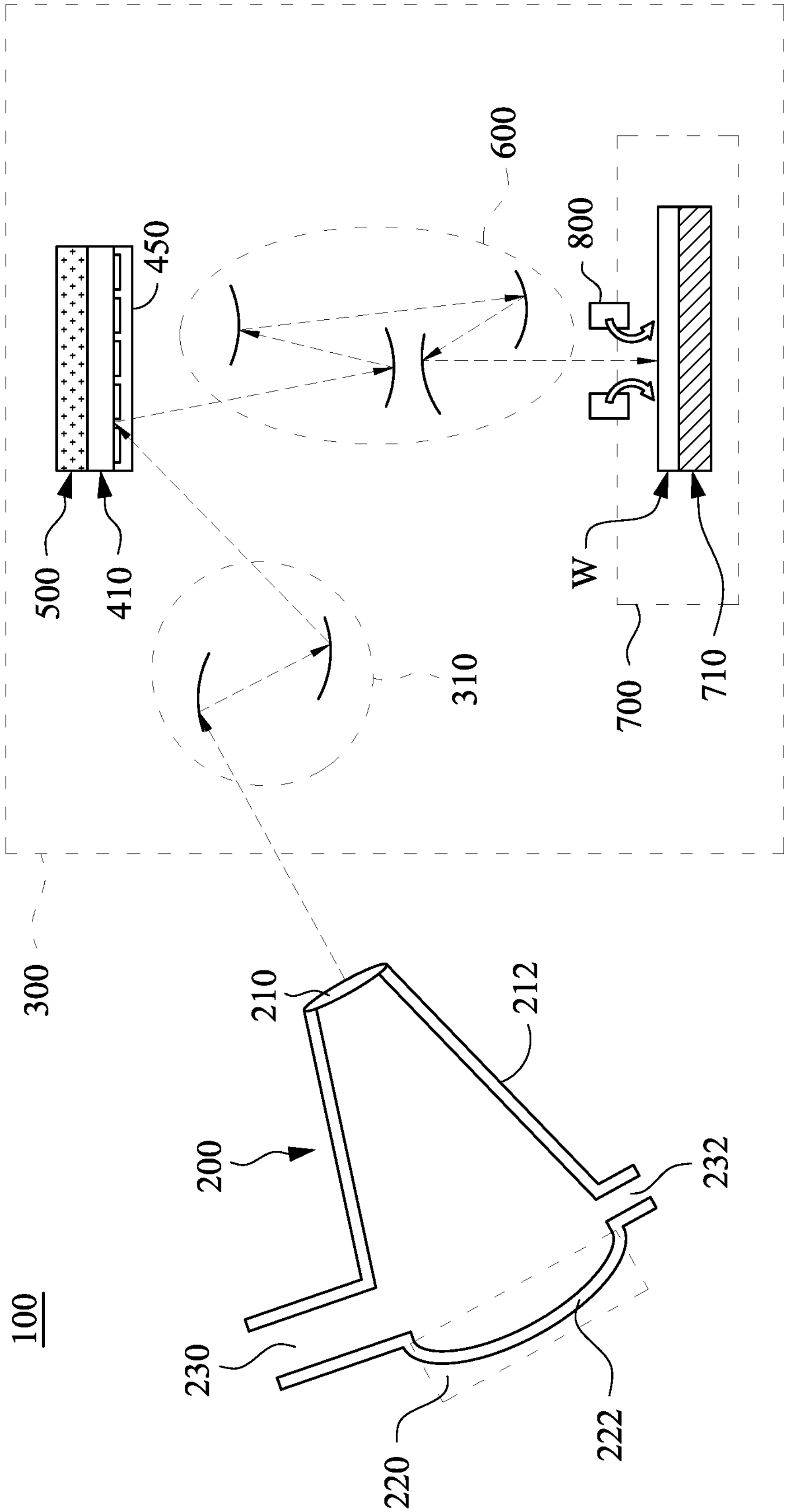
FIG. 1 diagrammatically illustrates an extreme ultraviolet (EUV) photolithography apparatus and/or system in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “left,” “right,” “side,” “back,” “rear,” “behind,” “front,” “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, as disclosed herein, extreme ultraviolet (EUV) photolithography is used in the fabrication and/or manufacture of semiconductor devices, for example, such as integrated circuits (ICs) and the like. An EUV scanner in accordance with some suitable embodiments may be employed to carry out the EUV photolithography. In practice, the EUV scanner may include or utilize a reticle or photomask or the like to transfer a pattern from the reticle to a photoresist coated semiconductor wafer or substrate, for example, selectively positioned in a wafer stage. The EUV scanner can also employ a dynamic gas lock (DGL) positioned in the optical path before the wafer stage on which the photoresist coated semiconductor wafer and/or substrate is secured to receive an exposure of EUV light during the EUV photolithography process. Optionally, the DGL may not have a DGL membrane or other like optical wavelength filter extending across the optical path between a projection optics box (POB) of the scanner and the wafer stage.

The DGL of some EUV scanners may include a DGL membrane. In general, during the exposure process, the DGL membrane can act to filter out-of-band (OoB) wavelengths of light (for example, infrared (IR) and/or deep ultraviolet (DUV) wavelengths) and/or otherwise inhibit such OoB wavelengths from reaching the photoresist coated semiconductor wafer and/or substrate positioned in the wafer stage. The OoB wavelength filtering function can be useful insomuch as the OoB wavelengths of light can result in defects occurring during the EUV exposure of the photoresist layer on the semiconductor wafer or substrate within the wafer stage. However, conventional DGL membranes can have a limited useful lifetime, for example, of about 6 months. Moreover, replacing and/or servicing the DGL membrane can be time consuming, for example, taking about 24 hours in some cases. The replacement and/or servicing of DGL membranes can result in significant down time for the EUV scanner.

In some suitable embodiments disclosed herein, the reticle mounted within an EUV scanner may be fitted or otherwise configured with a pellicle assembly, for example, comprising a nanotube membrane. Use of the pellicle assembly has the advantage of protecting the reticle, for example, a front surface thereof, from particles, debris and/or contaminates which can result in defects appearing on the photoresist coated semiconductor wafer or substrate undergoing exposure during the EUV photolithography process. In some suitable embodiments disclosed herein, the pellicle assembly may be constructed and/or configured with one or more suitable layers, for example, to filter out OoB wavelengths of light passing therethrough. One advantage of an illustrative pellicle assembly disclosed herein in accordance with some suitable embodiments is that the pellicle or nanotube membrane protects the reticle from debris, particles and/or contaminates. Another advantage of an illustrative pellicle assembly disclosed herein in accordance with some suitable embodiment is that OoB wavelengths of light passing therethrough are filtered out thereby protecting against potential defect which may be cause thereby during the exposure process. Another advantage of an illustrative pellicle assembly disclosed herein in accordance with some suitable embodiments is that it performs one or more functions of a DGL membrane, thereby allowing the DGL membrane to be omitted without loss of functionality in the EUV scanner. Hence, the operation of the EUV scanner is not disrupted by down time to replace and/or service a DGL membrane. Accordingly, a semiconductor manufacturing throughput of the EUV scanner is increased accordingly.

FIG. 1 shows an extreme ultraviolet (EUV) photolithography system 100 in accordance with some suitable embodiments of the present disclosure. EUV generally refers to ultraviolet light and/or radiation, for example, having wavelengths in a range of about 124 nanometers (nm) down to about 10 nm. More specifically, EUV photolithography, generally refers to photolithography employing EUV light and/or radiation as a light and/or illumination source. In some suitable embodiments, the EUV light and/or radiation employed may have, for example, wavelengths, roughly spanning a 2% full width at half-maximum (FWHM) bandwidth centered around about 13.5 nm. In practice, the EUV photolithography system 100 is operable to perform lithography exposing processes with a respective light or radiation source and exposure mode. As shown in FIG. 1, an EUV light source 200 injects EUV light through an intermediate focus (IF) cap 210 into an EUV scanner 300.

As illustrated in FIG. 1, the EUV light source 200 is generally formed from a housing or vessel 212 having at one end thereof the intermediate focus (IF) cap 210 including a window or hole or opening therein through which generated EUV light exits the EUV light source 200 and at another opposing end a collector chamber 220 in which a collector mirror 222 is located and/or housed. In practice, the EUV light and/or radiation generated by the EUV light source 200 exits the EUV light source 200 through the IF cap 210 and upon exiting through the IF cap 210 it proceeds, travels and/or is directed toward and/or to an illumination module 310 of the EUV scanner 300.

In one suitable embodiment, the housing or vessel 212 and/or the walls thereof generally form a frustoconical shape. In some other embodiments, a generally cylindrical or other suitable shape may be taken. In practice, the walls of the housing or vessel 212, the IF cap 210 and the collector chamber 220 with the collector mirror 222 installed therein cooperate to define an environmentally controlled chamber in which EUV radiation and/or light is generated, collected and/or focused. During operation of the EUV light source 200, as this environmentally controlled chamber is generally maintained at a pressure significantly below conventional atmospheric pressure, it is at times referred to and/or known as a vacuum chamber, although strictly speaking it may not in fact be at an absolute vacuum during operation of the EUV light source 200.

In some suitable embodiments, the EUV light source 200 is a laser-produced plasma (LPP) EUV light source, such as a pulsed tin plasma EUV light source. In operation, the EUV light source 200 may be driven by a high power laser (not shown) such as a carbon dioxide ($CO_2$) laser or another pulsed laser that injects or shoots a pulsed laser beam into the vacuum (or other environmentally controlled) chamber, for example, via an optical window. In some embodiments, the laser beam is injected from under or behind the collector mirror 222 and passes through a small hole, aperture or opening arranged at or near a center of the collector mirror 222. In some embodiments, the collector mirror 222 is a multi-layer construction forming a reflective mirror at and/or about the operative wavelength of the EUV light source 200. The collector mirror 222 may be an elliptical mirror that has one focus at or near an ignition site (i.e., where the laser beam strikes a target) and a second focus at or near the IF cap 210.

In practice, a target droplet generator may inject droplets of a target material (for example, tin) through a port 230 into the environmentally controlled chamber of the EUV light source 200. The target droplet is generally propelled toward a droplet catcher 232 on an opposing side of the environmentally controlled chamber of the EUV light source 200. Suitably, the optical pulses of the laser are timed to impinge on the target droplets (for example, at or near the ignition site) as they pass through the vacuum chamber to produce a plasma which generates extreme ultraviolet (EUV) radiation and/or light, for example, having wavelengths, roughly spanning a 2% FWHM bandwidth in a range centered somewhere around about 13.5 nm. In one embodiment, the EUV light source 200 produces EUV radiation and/or light having wavelengths in a range of between about 1 nm and about 100 nm. The collector mirror 222 installed in the collector chamber 220 operates to reflect and/or focus the plasma generated EUV radiation toward the IF cap 210, through which the EUV light exits the EUV light source 200. Upon exiting, the EUV light from the source 200 may by further shaped and/or directed by an optical system to form a EUV light beam which is aimed toward and/or transmitted to the illumination module 310 of the EUV scanner 300.

In practice, the EUV light source 200 may include other components known in the art, for example, such as a buffer gas system, including a buffer gas source, that flows and/or establishes a buffer gas (for example, hydrogen) within the environmentally controlled chamber to aid in the reduction of environmental contamination, atomic tin deposition and/or residue built-up in the chamber. In some embodiments, a number of vanes (not shown) may be formed on and distributed around an inner wall of the vessel or housing 212 to provide receiving surfaces for target droplets that may go astray. That is to say, some target droplets and/or fragments thereof produced by interaction with the laser pulses, on occasion, may not travel strictly in the desired path toward the droplet catcher 232, and when they are incident on the inner wall(s) of the vessel or housing 212, the vanes act to retain the tin or other liquid target material. The vanes are optionally heated to above the melting temperature of the material of the target droplets using any suitable manner of heating. In addition, a gutter (not shown) may be provided at one end of the vanes and connected to a drain (not shown) in order to recover the stray target material flowing from and/or along the vanes.

In some suitable embodiments, a horizontal obstruction (HO) bar (not shown) is optionally installed in the EUV light source 200. The HO bar operates to and/or aids in blocking laser light from exiting through the IF cap 210 when it is not impinging upon target droplets. In some suitable embodiments, a scrubber operates to and/or aids in removing and/or otherwise cleaning contaminates, particles, residue and the like from any buffer or other gas used in the environmentally controlled chamber.

In some suitable embodiments, the collector mirror 222 is suitably contained in a drawer or the like which is selectively placed and/or housed in the collector chamber 220. For example, the drawer containing the collector mirror 222 may be selectively positioned in or out of the collector chamber 220. During operation of the EUV light source 200, the drawer is placed and/or positioned in the collector chamber 220 thereby installing the collector mirror 222 in the EUV light source 200 so that it may collect and/or focus the generated EUV radiation created as the periodically or intermittently injected target droplets are struck by the laser pulses. During down time or when the EUV light source 200 is otherwise not in operation, the drawer containing the collector mirror 222 may be selectively removed from and/or positioned outside the collector chamber 220, for example, to allow for the ready inspection, cleaning, maintenance and/or replacement of the collector mirror 222. When the drawer containing the collector mirror 222 is removed from the collector chamber 220, this also grants one access through the collector chamber 220 to the interior (i.e., the otherwise environmentally controlled chamber) of the EUV light source 200, thereby permitting the inspection, cleaning and/or maintenance thereof.

Figure 2:
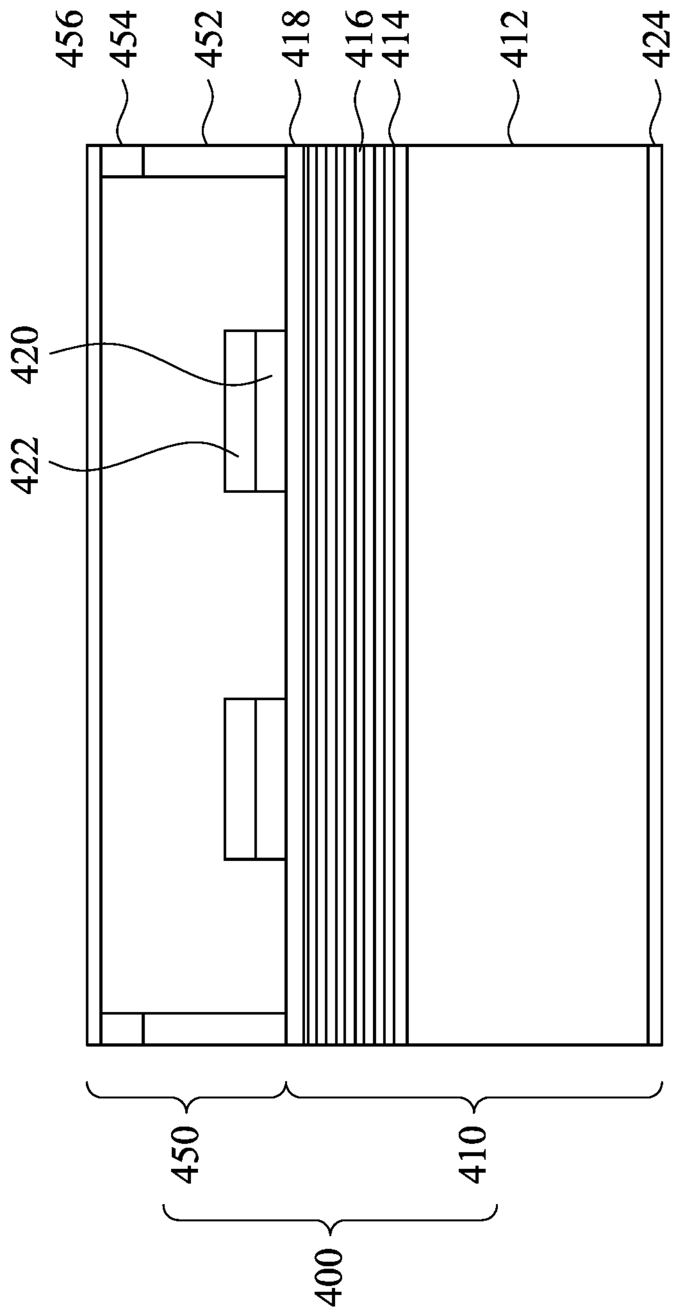
FIG. 2 diagrammatically illustrates a cross-section view of a reticle assembly in accordance with some embodiments disclosed herein.

As shown in FIG. 1, the EUV scanner 300 includes the illumination module 310 which is arranged to receive the EUV light and/or radiation emitted from the EUV light source 200. In some suitable embodiments, the illumination module 310 includes one or more optical elements (for example, mirrors) that cooperate to illuminate a reticle 410 (also referred to herein as a mask or photomask or the like) with the light and/or radiation injected into the EUV scanner 300 from the light source 200. In practice, the mask or reticle 410 may be part of a reticle assembly 400 (as seen in FIG. 2) or the like which is positioned on or secured to or held by a mount 500, for example, including an electrostatic chuck (e-chuck) or the like. In some suitable embodiments, for example, particularly for an EUV photolithography system, the mask or reticle 410 is a reflective mask/reticle.

FIG. 2 illustrates a cross-sectional view of a suitable reticle assembly 400 in accordance with some embodiments disclosed herein. As shown, the reticle assembly 400 includes the reticle 410 and a pellicle assembly 450. In some suitable embodiments, the illustrative reticle 410 (also referred to in the art as a mask, photomask, or similar phraseology) is a reflective mask of a type used in EUV photolithography, and includes a substrate 412, alternating reflective layers 414 and spacing layers 416, a capping layer 418, an EUV absorbing layer 420 that is patterned to define a mask pattern, an anti-reflective coating (ARC) 422, and a conductive backside layer 424. It is to be appreciated that the illustrative reticle 410 is merely a nonlimiting example.

More generally, substantially any type of reflective or transmission reticle may be used in accordance with some embodiments disclosed herein. As another example (not shown), the reticle may be a transmission reticle, in which case the substrate is transmissive for light at the wavelength at which the lithography is performed.

In general, the reticle includes a substrate (for example, substrate 412) and a mask pattern (for example, defined by the patterned absorbing layer 420) disposed on the substrate. As illustrated here, the pellicle assembly 450 includes a mounting frame 452, an adhesive layer 454, and a pellicle membrane 456. In some non-limiting illustrative embodiments, the reticle and pellicle assembly are intended for use with EUV light wavelengths, for example from about 124 nm to about 10 nm, including about 13.5 nm.

In some suitable embodiments, the substrate 412 is made from a low thermal expansion material (LTEM), such as quartz or titania silicate glasses. This reduces or prevents warping of the reticle due to absorption of energy and consequent heating. The alternating reflective layers 414 and the spacing layers 416 cooperate to form a Bragg reflector for reflecting EUV light. In some embodiments, the reflective layers 414 may comprise molybdenum (Mo). In some embodiments, the spacing layers may comprise silicon (Si). The capping layer 418 is generally employed to protect the reflector formed from the reflective layers 414 and the spacing layers 416, for example, from oxidation. In some embodiments, the capping layer comprises ruthenium (Ru). In practice, the EUV absorbing layer 420 absorbs EUV wavelengths of light, and is patterned with the desired pattern or image to be projected. In some embodiments, the EUV absorbing layer comprises tantalum boron nitride (Ta—B—N). The anti-reflective coating (ARC) 422 further reduces reflection of EUV light from the EUV absorbing layer 420. In some embodiments, the anti-reflective coating comprises oxidized Ta—B—N. The conductive backside layer 424 permits mounting of the illustrative reticle 410 on an e-chuck and/or temperature regulation of the mounted substrate 412. In some suitable embodiments, the conductive backside layer comprises chrome nitride (CrN).

Figure 3:
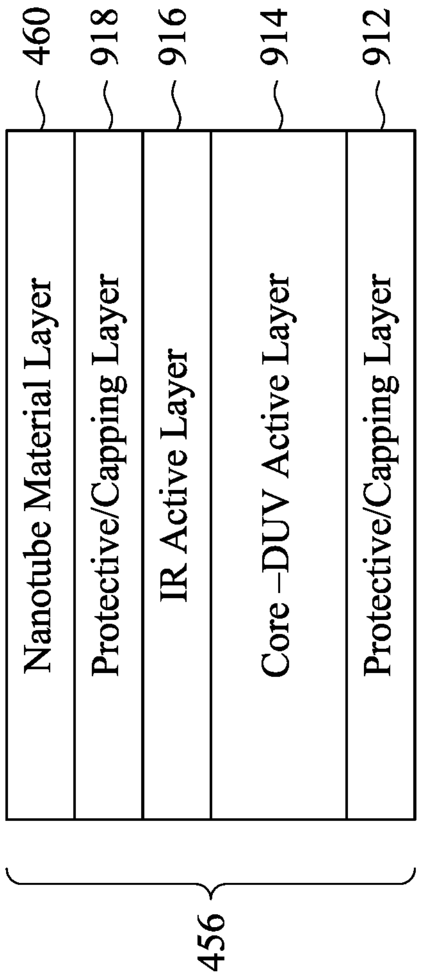
FIG. 3 diagrammatically illustrates a cross-section view of a pellicle membrane in accordance with some embodiments disclosed herein.

At shorter light wavelengths, particle, debris and/or contaminants on the reticle 410 can cause defects in the transferred pattern. Thus, the disclosed pellicle assembly 450 may be used to protect the reticle 410 from such particles, debris and/or contaminates. In practice, the pellicle assembly 450 and/or pellicle membrane 456, protects the reticle 410, for example, from particles, debris and/or contaminates falling and/or landing on the reticle 410. As shown, the mounting frame 452 supports the pellicle membrane 456 over the reticle 410. Accordingly, any contaminating particles which land on the pellicle membrane 456 are suitably kept out of the focal plane of the reticle 410, thus reducing or preventing defects in the transferred pattern. In some suitable embodiments, the pellicle membrane 456 is substantially transmissive to EUV light and/or radiation, for example, at and/or around the operating wavelength(s) of the EUV photolithography system 100. Suitably, the pellicle membrane 456 may be constructed of or from or otherwise include a nanotube material layer 460 (for example, as seen in FIG. 3) or the like. In some embodiments, the pellicle membrane's nanotube material layer 460 may be a single-layer structure, while in other embodiments, the pellicle membrane's nanotube material layer 460 may be a multi-layer structure. For example, in some embodiments, the pellicle membrane's nanotube material layer 460 may comprise one or more nanotube membrane layers and one or more graphene membrane layers. A combination of several low-density membrane layers can be used to obtain a nanotube material layer 460 that has a combination of high EUV light transmittance, small pore size and a stiffness which minimizes potential deflection.

In some embodiments, the nanotubes can be carbon nanotubes (CNTs) or boron nitride nanotubes (BN-NTs) or silicon carbide nanotubes (SiC-NTs) or molybdenum disulfide nanotubes ($MoS_2$-NTs) or molybdenum diselenide nanotubes ($MoSe_2$-NTs) or tungsten disulfide nanotubes ($WS_2$-NTs) or tungsten diselenide nanotubes ($WSe_2$-NTs) or silicon nitride nanotubes (SiN-NTs) or molybdenum/silicon nitride/ruthenium nanotubes (Mo/SiN/Ru-NTs) or molybdenum/silicon nitride nanotubes (Mo/SiN-NTs) or ruthenium/silicon nitride nanotubes (Ru/SiN-NT) or combinations thereof. In some embodiments, the nanotubes can be metallic or semiconducting or electrically insulating.

In some embodiments, the nanotubes can be single-wall nanotubes or multi-wall nanotubes. It is possible for multi-wall nanotubes to be made of different materials, for example a CNT inside a BN-NT, or vice versa or other combination. In some embodiments, single-wall nanotubes may have a diameter from about 0.2 nanometers (nm) to about 4 nm, and a length of about 0.5 micrometers (μm) to about 30 μm, although these may vary. In some embodiments, multi-wall nanotubes may have a diameter from about 10 nm to about 250 nm, and a length of about 250 μm to about 400 μm, although these may vary. In some embodiments, the length of the individual nanotubes may be from about 1,000 μm to about 6 centimeters (cm) as well. It is noted that typically a mix of single-wall nanotubes and multi-wall nanotubes may be present in the nanotube membrane. Because high EUV transmittance is desired and multi-wall nanotubes have relatively lower EUV transmittance, the amount of multi-wall nanotubes in the nanotube fibers or bundles of the present disclosure is usually less than 50% by number. Nevertheless, in some suitable embodiments, the pellicle membrane 456 suitably blocks, filters and/or absorbs or otherwise inhibits transmittance of DUV light.

In practice, the nanotubes of the pellicle membrane's nanotube material layer 460 may exhibit different properties. For example, carbon nanotubes can have a Young's modulus of about 1.33 TPa; a maximum tensile strength of about 100 GPa; thermal conductivity of about 3,000 to about 40,000 W/mK; and be stable up to a temperature of about 400° C. in air. Boron nitride nanotubes can have a Young's modulus of about 1.18 TPa; a maximum tensile strength of about 30 GPa; thermal conductivity of about 3000 W/mK; and be stable up to a temperature of about 800° C. in air. Furthermore, while the nanotube material layer 460 is shown as an illustrative embodiment, more generally the layer 460 may a support layer 460 that provides structural support for the pellicle membrane 456. The support layer 460 could be made of another material and/or structure that provides sufficient structural support for the pellicle membrane 456 while being light-transmissive for the EUV wavelength or other wavelength used in the lithography. For example, the support layer 460 may comprise a thin layer of silicon nitride (SiN) material.

In some suitable embodiments, the mounting frame 452 supports the pellicle membrane 456 at a height sufficient to take the pellicle membrane 456 outside a focal plane of the lithography, for example, several millimeters (mm) over the reticle 410 in some nonlimiting illustrative embodiments. The mounting frame 452 itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane 456.

The adhesive layer 454 is used to secure the pellicle membrane 456 to the mounting frame 452. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system 100, to prevent the adhesive from exceeding the Tg during operation.

Returning attention to FIG. 1, in some suitable embodiments, the EUV scanner 300 also includes a projection module 600, also referred to herein as a projection optics box (POB). The POB 600 of the EUV scanner 300 projects the image of the mask/reticle 410 (for example, via light reflected therefrom as a result of the mask/reticle's illumination by the illumination module 310) onto a semiconductor wafer and/or substrate W (for example, a silicon wafer on which semiconductor fabrication is being performed). As shown, the semiconductor wafer or substrate W may be positioned, secured and/or held within a wafer stage 700 or other like chamber, for example, on a wafer mount 710 which may include an e-chuck or the like. In practice, the semiconductor wafer or substrate W may be coated with a layer of photoresist to perform the EUV exposure. Suitably, the POB 600 may include one or more optical elements (for example, mirrors) that are configured and/or cooperate to image the pattern of the mask/reticle 410 onto the photoresist layer of the semiconductor wafer and/or substrate W positioned within the wafer stage 700 of the EUV scanner 300. In practice, various elements and/or components can be added to and/or omitted from the EUV photolithography system 100, and the disclosed embodiments herein are not meant to be limited by that which is shown in FIG. 1.

With continued reference to FIG. 1, in some embodiments of an EUV scanner, a dynamic gas lock (DGL) may be interposed in a path of the light between the POB 600 and the wafer stage 700 of the EUV scanner 300 such that the EUV light projected from POB 600 onto the semiconductor wafer or substrate W positioned in the wafer stage 700 passes through the DGL 800.

In some suitable embodiment, the POB 600, wafer stage 700 and/or DGL 800 may be maintained within the EUV scanner 300 under environmentally controlled conditions, for example, including a vacuum environment. In general, these environmentally controlled conditions may include maintaining a pressure which can be significantly below conventional atmospheric pressure, and accordingly at times the term vacuum may be employed to describe these conditions, although strictly speaking there may not in fact be at an absolute vacuum during operation of the EUV scanner 300.

In some suitable embodiments, for example, as seen in FIG. 1, the DGL 800 may not include a DGL membrane through which EUV light projected from the POB 600 passes on its way into the wafer stage 700 where it impinges on the semiconductor wafer and/or substrate W positioned therein. In practice, the DGL 800 helps to, at least partially, environmentally isolates the POB 600 and/or the optical elements therein from the wafer stage 700, thereby protecting the POB 600 and/or optical elements therein from contaminates which may originate from within the wafer stage 700, for example, due to outgassing from the photoresist being patterned on the semiconductor wafer or substrate W as a result of exposure to the EUV light projected from the POB 600, or other sputtered materials, particles or debris.

In some suitable embodiments, the DGL 800 may create or introduce a flow of purge gas within the DGL 800 and/or the wafer stage 700 that acts to inhibit debris or particles from falling or landing or remaining on and/or otherwise contaminating elements or components of the EUV scanner 300, for example, such as the POB 600 and/or the optical elements therein, the semiconductor wafer or substrate W itself, etc. In practice, the gas flow may act to deflect and/or otherwise carry such debris, particle and/or contaminates away from the protected components and/or elements. In some suitable embodiments, the purge gas may be hydrogen ($H_2$) or another suitable gas or combination of gases.

With reference now to FIG. 3, in some suitable embodiments, the pellicle membrane 456 also helps filter out-of-band (OoB) wavelengths of light potentially passing therethrough from reaching the semiconductor wafer or substrate W positioned in the wafer stage 700. For example, such OoB wavelengths of light generally include those wavelengths not within the operating wavelength bandwidth of the EUV system 100 and which can potentially introduce defects in the mask pattern being transferred. For example, the OoB wavelengths may include infrared (IR) wavelengths (for example, in a range of between about 700 nm to about 1 millimeter (mm), inclusive) and/or deep ultraviolet (DUV) wavelengths (for example, in a range of between about 10 nm to about 400 nm, inclusive, or a range whose lower limit is above about 13.5 nm if that is the EUV wavelength at which the EUV scanner 300 operates).

FIG. 3 illustrates a cross-sectional view of a suitable pellicle membrane 456 in accordance with some embodiments disclosed herein. As shown, the pellicle membrane 456 includes the nanotube material membrane layer 460 and one or more additional membrane layers. In some suitable embodiments, the illustrative pellicle membrane 456 is generally of a type used in EUV photolithography, and may include one or more additional membrane layers, for example, includes a first protective or capping layer 912, a core or DUV active layer 914, an IR active layer 916 and a second protective or capping layer 918. In some suitable embodiments, the pellicle membrane 456 may have a thickness in a range of between about 30 nm and about 50 nm, inclusive, and each of the additional membrane layers thereof (for example layers 912 through 918) may have a thickness in a range of between about 5 nm and about 15 nm, inclusive. It is to be appreciated that the illustrative pellicle membrane 456 is merely a nonlimiting example.

In some suitable embodiments, the first protective or capping layer 912 may comprise zirconium dioxide ($ZrO_2$) material or the like and acts as a protective layer for other internal layers of the pellicle membrane 456, for example, protecting the same from oxidation and/or damage. In some suitable embodiments, the core or DUV active layer 914 may comprise p-type silicon (pSi) material or the like. Suitably, the core or DUV active layer 914 acts to filter out and/or absorb DUV wavelengths of light passing therethrough. In some suitable embodiments, the IR active layer 916 may comprise molybdenum (Mo) material or the like. Suitably, the IR active layer 916 acts to filter out and/or absorb IR wavelengths of light passing therethrough. In some suitable embodiments, the second protective or capping layer may comprise molybdenum oxysilicide or molybdenum-doped silicon oxide ($MoSi_xO_y$) material or the like and acts as a protective layer for other internal layers of the pellicle membrane 456, for example, protecting the same from oxidation and/or damage.

It is generally desired to keep the reticle 410 free of particles, debris and/or contaminants which can cause defects in the transferred pattern. Further, it is generally desired to keep OoB wavelengths of light (for example, DUV light) potentially from reaching the wafer stage 700, in particular, when such OoB wavelengths of the light can cause defects during the EUV exposure of the photoresist layer on the semiconductor wafer or substrate W within the wafer stage 700.

Thus, the disclosed pellicle assembly 450 may be used to protect the reticle 410 from such particles, debris and/or contaminates. In practice, the pellicle assembly 450 and/or pellicle membrane 456, protects the reticle 410, for example, from particles, debris and/or contaminates falling and/or landing on the reticle 410. In some suitable embodiments, the pellicle assembly 450 and/or pellicle membrane 456 may have a thickness in a range of between about 20 nm and about 100 nm, inclusive. As shown, the mounting frame 452 supports the pellicle membrane 456 over the reticle 410. In some suitable embodiments, the pellicle membrane 456 is substantially transparent and/or transmissive to EUV light and/or radiation, for example, at and/or around the operating wavelength(s) of the EUV photolithography system 100.

As shown in FIG. 3, the nanotube material layer 460 of the pellicle assembly 450 is arranged on a first side of the pellicle membrane 456, i.e., next to or adjacent or otherwise proximate the second protective or capping layer 918. In some alternate embodiments, the nanotube material layer 460 of the pellicle assembly 450 may be arranged on a second side of the pellicle membrane 465, i.e., next to or adjacent or otherwise proximate the first protective or capping layer 912. In still some other suitable embodiments, a nanotube material layer of the pellicle assembly 450 (for example, such as the nanotube material layer 460) may be arranged on both the first and second sides of the pellicle membrane 456. In yet other suitable embodiments, the nanotube material layer 460 of the pellicle assembly 450 may be situated and/or arranged within, between and/or among the various other layers of the pellicle membrane 456, i.e., within, between and/or among the first protective or capping layer 912, the core or DUV active layer 914, the IR active layer 916 and/or the second protective or capping layer 918.

Figure 4:
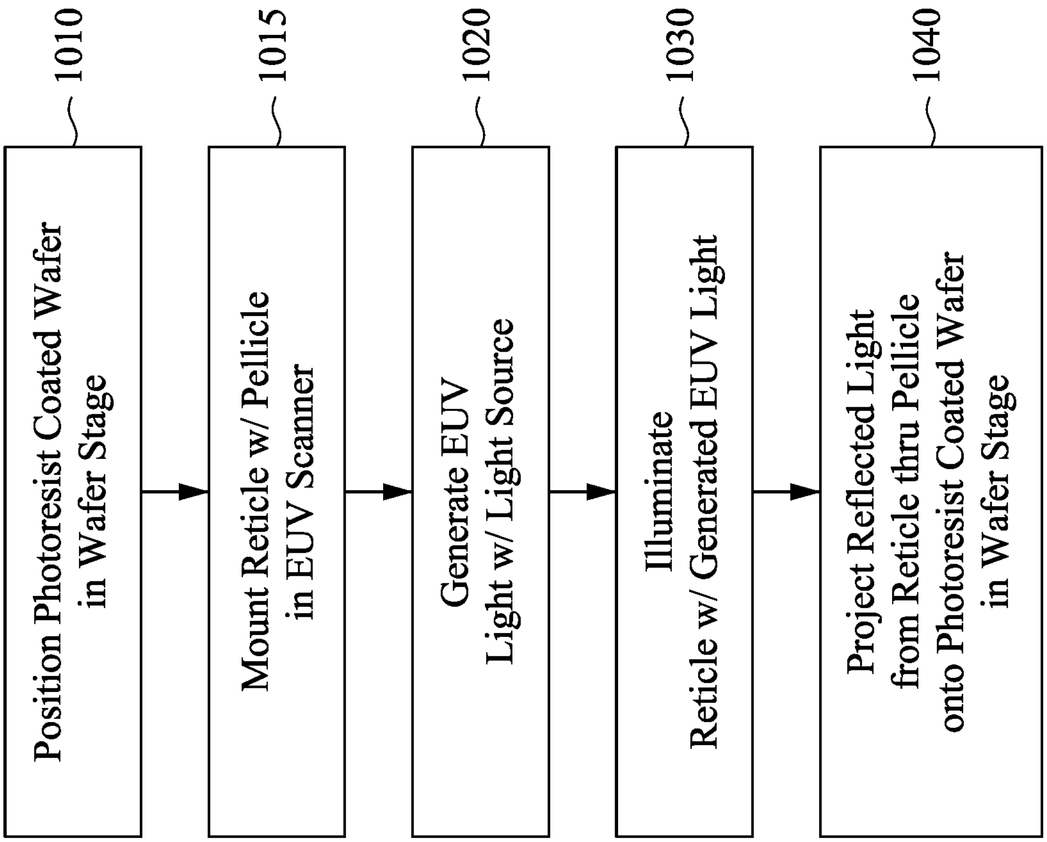
FIG. 4 is a flow chart showing an EUV photolithography method in accordance with some embodiments disclosed herein.

With reference now to FIG. 4, an EUV photolithography method and/or process 1000 in accordance with some suitable embodiments of the present disclosure is shown.

As shown, at step 1010, a photoresist coated semiconductor wafer or substrate (for example, such as the semiconductor wafer of substrate W shown in FIG. 1) may be loaded into the wafer stage 700 of the EUV scanner 300.

At step 1015, a reticle assembly (for example, such as the reticle assembly 400 shown in FIG. 2, including the reticle 410 and pellicle assembly 450) is mounted in the EUV scanner 300 (for example, via the reticle mount 500).

At step 1020, EUV light is generated, for example, by the EUV light source 200. In practice, the EUV light generated by the EUV light source 200 may in turn exit the EUV light source 200 through the IF cap 210 and be injected into the EUV scanner 300, for example, directed toward the illumination module 310 of the EUV scanner 300.

At step 1030, the EUV light generated in step 1020 by the EUV light source 200 is used to illuminate the reticle 410 mounted in the EUV scanner 300 (for example, via the illumination module 310 of the EUV scanner 300).

At step 1040, the EUV light reflected from the reticle 410 is projected, for example, by the POB 600 of the scanner 300 through the DGL 800 into the wafer stage 700 and onto the photoresist coated semiconductor wafer and/or substrate W contained in the wafer stage 700. Suitably, the light reflected from the reticle 410 toward the POB 600 of the EUV scanner 300 is selectively wavelength filtered by the pellicle assembly 450 and/or pellicle membrane 456 covering the reticle 410 as it passes therethrough.

In the following, some further illustrative embodiments are described.

In some embodiments, a pellicle assembly is provided which covers a reticle in an extreme ultraviolet (EUV) scanner that performs EUV photolithography for the fabrication of semiconductor devices. The pellicle assembly includes a pellicle membrane arranged in an optical path between the reticle and a projection optics box (POB) of the EUV scanner, the POB projecting EUV light reflected from the reticle through the pellicle membrane onto a photoresist coated semiconductor wafer positioned within a wafer stage to transfer a mask pattern defined by the reticle onto the photoresist. The pellicle membrane includes: a nanotube material layer; a first protective layer proximate a first side of the pellicle membrane; a second protective layer proximate a second side of the pellicle membrane, the second side being opposite the first side; an infrared (IR) active layer arranged between the first protective layer and the second protective layer, the IR active layer filtering out IR wavelengths of light passing therethrough; and a deep ultraviolet (DUV) active layer arranged between the first protective layer and the second protective layer, the DUV active layer filtering out DUV wavelengths of light passing therethrough.

In some further embodiments, the nanotube material layer includes a nanotube membrane including at least one of carbon nanotubes, boron nitride nanotubes, silicon carbide nanotubes, molybdenum disulfide nanotubes, molybdenum diselenide nanotubes, tungsten disulfide nanotubes, tungsten diselenide nanotubes, silicon nitride nanotubes, molybdenum/silicon nitride/ruthenium nanotubes, molybdenum/silicon nitride nanotubes, ruthenium/silicon nitride nanotubes or combinations thereof.

In still additional embodiments, the nanotube membrane includes at least one of single-wall nanotubes, multi-wall nanotubes or combinations thereof.

In some embodiments, the nanotube material layer is arranged on a side of the pellicle membrane facing the POB.

In yet further embodiments, the nanotube material layer is arranged on a side of the pellicle membrane facing the reticle.

In some further embodiments, the first protective layer comprises zirconium dioxide; the DUV active layer comprises p-type silicon; the IR active layer comprises molybdenum; and the second protective layer comprises molybdenum-doped silicon oxide.

In some embodiments, when mounted to the associated reticle within the EUV scanner, the pellicle assembly positions the pellicle membrane in an optical path between the associated reticle and a projection optics box (POB) of the EUV scanner, said POB projecting EUV light reflected from the reticle through the pellicle membrane onto a photoresist coated semiconductor wafer positioned within a wafer stage to transfer a mask pattern defined by the reticle onto the photoresist.

In yet further embodiments, an extreme ultraviolet (EUV) scanner is provided which performs EUV photolithography for the fabrication of semiconductor devices. The scanner includes: a wafer stage in which a photoresist coated semiconductor wafer is selectively positioned; a reticle mount to which a reticle is selectively mounted, the reticle including an EUV light absorbing layer defining a pattern to be transfer to the photoresist coated semiconductor wafer; a pellicle assembly which includes a pellicle membrane that covers the reticle mounted to the reticle mount; an illumination module including one or more optical elements that cooperate to illuminate the reticle mounted to the reticle mount with light generated by an EUV light source; and a projection optic box (POB) including one or more optical elements that cooperate to project light reflected from the reticle through the pellicle membrane onto the photoresist coated semiconductor wafer positioned in the wafer stage. Suitably, the pellicle membrane includes: a nanotube material layer; a first protective layer; a second protective layer; an infrared (IR) active layer arranged between the first protective layer and the second protective layer, the IR active layer filtering out IR wavelengths of light passing therethrough; and a deep ultraviolet (DUV) active layer arranged between the first protective layer and the second protective layer, the DUV active layer filtering out DUV wavelengths of light passing therethrough.

In some embodiments, the pellicle assembly further includes a frame in which the pellicle membrane is supported.

In some further embodiments, the nanotube material layer includes a nanotube membrane including at least one of carbon nanotubes, boron nitride nanotubes, silicon carbide nanotubes, molybdenum disulfide nanotubes, molybdenum diselenide nanotubes, tungsten disulfide nanotubes, tungsten diselenide nanotubes, silicon nitride nanotubes, molybdenum/silicon nitride/ruthenium nanotubes, molybdenum/silicon nitride nanotubes, ruthenium/silicon nitride nanotubes or combinations thereof.

In still one more embodiment, the nanotube membrane comprises at least one of single-wall nanotubes, multi-wall nanotubes or combinations thereof.

In still further embodiments, the nanotube membrane is arranged on an outer side of the pellicle membrane facing one of the POB or the reticle.

In yet additional embodiments, the nanotube membrane is arranged between the first protective layer and the second protective layer.

In some further embodiments, the pellicle membrane is transmissive to EUV wavelength light.

In some additional embodiments, the first protective layer comprises zirconium dioxide; the DUV active layer comprises p-type silicon; the IR active layer comprises molybdenum; and the second protective layer comprises molybdenum-doped silicon oxide.

In some embodiments, a method of performing EUV photolithography for the fabrication of semiconductor devices includes: positioning a photoresist coated semiconductor wafer in a wafer stage; mounting a reticle to a reticle mounted, the reticle including an EUV light absorbing layer defining a pattern to be transfer to the photoresist coated semiconductor wafer; covering the reticle with a pellicle membrane which extends across an optical path of light reflected from the reticle mounted to the reticle mount; illuminating the reticle mounted to the reticle mount with light provided from an EUV light source; and projecting light reflected from the reticle through the pellicle membrane onto the photoresist coated semiconductor wafer positioned in the wafer stage. In some suitable embodiments, the pellicle membrane includes: a nanotube material layer; a first protective layer; a second protective layer; an infrared (IR) active layer arranged between the first protective layer and the second protective layer, the IR active layer filtering out IR wavelengths of light passing therethrough; and a deep ultraviolet (DUV) active layer arranged between the first protective layer and the second protective layer, the DUV active layer filtering out DUV wavelengths of light passing therethrough.

In some embodiments, the method further includes supporting the pellicle membrane in a frame such that the pellicle membrane is spaced apart from the reticle.

In some further embodiments, the nanotube material layer includes a nanotube membrane comprising at least one of carbon nanotubes, boron nitride nanotubes, silicon carbide nanotubes, molybdenum disulfide nanotubes, molybdenum diselenide nanotubes, tungsten disulfide nanotubes, tungsten diselenide nanotubes, silicon nitride nanotubes, molybdenum/silicon nitride/ruthenium nanotubes, molybdenum/silicon nitride nanotubes, ruthenium/silicon nitride nanotubes or combinations thereof.

In still further embodiments, the pellicle membrane is transmissive to EUV wavelength light.

In yet further embodiments, the first protective layer comprises zirconium dioxide; the DUV active layer comprises p-type silicon; the IR active layer comprises molybdenum; and the second protective layer comprises molybdenum-doped silicon oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing EUV photolithography for the fabrication of semiconductor devices, said method comprising:

positioning a photoresist coated semiconductor wafer in a wafer stage;

mounting a reticle to a reticle mount, said reticle including an EUV light absorbing layer defining a pattern to be transferred to the photoresist coated semiconductor wafer;

covering the reticle with a pellicle membrane which extends across an optical path of light reflected from the reticle mounted to the reticle mount;

illuminating the reticle mounted to the reticle mount with light provided from an EUV light source; and projecting light reflected from the reticle through the pellicle membrane onto the photoresist coated semiconductor wafer positioned in the wafer stage;

wherein said pellicle membrane includes:

a nanotube material layer;

a first protective layer that comprises zirconium oxide;

a second protective layer that comprises molybdenum-doped silicon oxide;

an infrared (IR) active layer, said IR active layer filtering out IR wavelengths of light passing therethrough; and a deep ultraviolet (DUV) active layer, said DUV active layer filtering out DUV wavelengths of light passing therethrough, wherein the IR active layer is arranged between the second protective layer and the DUV active layer.

2. The method of claim 1, further comprising supporting the pellicle membrane in a frame such that the pellicle membrane is spaced apart from the reticle.

3. The method of claim 2, wherein the frame is made from anodized aluminum, stainless steel, plastic, silicon (Si), titanium, silicon dioxide, aluminum oxide ($Al_2O_3$), or titanium dioxide ($TiO_2$).

4. The method of claim 2, wherein the frame includes vent holes.

5. The method of claim 1, wherein the nanotube material layer includes:

a nanotube membrane comprising at least one of carbon nanotubes, boron nitride nanotubes, silicon carbide nanotubes, molybdenum disulfide nanotubes, molybdenum diselenide nanotubes, tungsten disulfide nanotubes, tungsten diselenide nanotubes, silicon nitride nanotubes, molybdenum/silicon nitride/ruthenium nanotubes, molybdenum/silicon nitride nanotubes, ruthenium/silicon nitride nanotubes or combinations thereof.

6. The method of claim 5, wherein the nanotube membrane comprises at least one of single-wall nanotubes, multi-wall nanotubes or combinations thereof.

7. The method of claim 5, wherein the nanotubes have a length of from about 1,000 micrometers to about 6 centimeters.

8. The method of claim 1, wherein the pellicle membrane is transmissive to EUV wavelength light.

9. The method of claim 1, wherein:

the DUV active layer comprises p-type silicon; and the IR active layer comprises molybdenum.

10. The method of claim 1, wherein the nanotube material layer is arranged on a side of the pellicle membrane facing the reticle.

11. The method of claim 1, wherein the light reflected from the reticle through the pellicle membrane is projected onto the photoresist coated semiconductor wafer by a projections optic box; and wherein the nanotube material layer is arranged on a side of the pellicle membrane facing the projections optic box.

12. The method of claim 1, wherein the pellicle membrane has a thickness of about 20 nanometers to about 100 nanometers.

13. The method of claim 1, wherein the nanotube material layer is between the first protective layer and the second protective layer.

14. A method of performing EUV photolithography for the fabrication of semiconductor devices, said method comprising:

placing a photoresist coated semiconductor wafer in a wafer stage;

projecting EUV light upon a reticle, said reticle defining a pattern to be transferred to the photoresist coated semiconductor wafer; and projecting light reflected from the reticle onto the photoresist coated semiconductor wafer positioned in the wafer stage;

wherein the reticle is covered with a pellicle membrane that includes, in sequence:

a nanotube material layer;

a second protective layer that comprises molybdenum-doped silicon oxide;

an infrared (IR) active layer contacting the second protective layer, said IR active layer filtering out IR wavelengths of light passing therethrough; and a deep ultraviolet (DUV) active layer contacting the IR active layer, said DUV active layer filtering out DUV wavelengths of light passing therethrough; and a first protective layer contacting the DUV active layer.

15. The method of claim 14, wherein:

the first protective layer comprises zirconium dioxide;

the DUV active layer comprises p-type silicon; and the IR active layer comprises molybdenum.

16. The method of claim 14, wherein the nanotube material layer is arranged on a side of the pellicle membrane facing the reticle.

17. The method of claim 14, wherein the nanotube material layer is arranged on a side of the pellicle membrane facing the projections optic box.

18. A method of performing EUV photolithography for the fabrication of semiconductor devices, said method comprising:

placing a photoresist coated semiconductor wafer in a wafer stage;

illuminating a reticle with EUV light, said reticle defining a pattern to be transferred to the photoresist coated semiconductor wafer; and sending light reflected from the reticle through a projection optics box onto the photoresist coated semiconductor wafer positioned in the wafer stage;

wherein the reticle is covered with a pellicle membrane that includes, in sequence:

a nanotube material layer;

a second protective layer that comprises molybdenum-doped silicon oxide;

an infrared (IR) active layer, said IR active layer filtering out IR wavelengths of light passing therethrough;

a deep ultraviolet (DUV) active layer, said DUV active layer filtering out DUV wavelengths of light passing therethrough; and a first protective layer that comprises zirconium dioxide.

19. The method of claim 18, wherein the nanotube material layer is arranged on a side of the pellicle membrane facing the reticle.

20. The method of claim 18, wherein the nanotube material layer is arranged on a side of the pellicle membrane facing the projections optic box.

* * * * *